(12) United States Patent
Arai et al.

(10) Patent No.: US 7,702,979 B2
(45) Date of Patent: Apr. 20, 2010

(54) SEMICONDUCTOR INTEGRATED CIRCUIT INCORPORATING TEST CONFIGURATION AND TEST METHOD FOR THE SAME

(75) Inventors: Masayuki Arai, Tama (JP); Kazuhiko Iwasaki, Yokohama (JP); Satoshi Fukumoto, Kawasaki (JP); Takeshi Shoda, Kokubunji (JP); Junichi Nishimoto, Kawasaki (JP)

(73) Assignee: Semiconductor Technology Academic Research Center, Yokohama-Shi (JP)

( * ) Notice: Subject to any disclaimer, the term of this patent is extended or adjusted under 35 U.S.C. 154(b) by 886 days.

(21) Appl. No.: 11/397,899

(22) Filed: Apr. 5, 2006

(65) Prior Publication Data

US 2006/0282730 A1    Dec. 14, 2006

(30) Foreign Application Priority Data

Apr. 6, 2005 (JP) .............................. 2005-109537

(51) Int. Cl.
G01R 31/28 (2006.01)
(52) U.S. Cl. ...................................... 714/726
(58) Field of Classification Search ................. 714/724, 714/726, 733, 734, 30, 729, 738; 716/4
See application file for complete search history.

(56) References Cited

U.S. PATENT DOCUMENTS 6,148,425 A * 11/2000 Bhawmik et al. ........... 714/726
6,370,664 B1 * 4/2002 Bhawmik ................... 714/729
7,036,060 B2 * 4/2006 Nakao et al. ................ 714/726
2003/0070118 A1 * 4/2003 Nakao et al. ................. 714/30

FOREIGN PATENT DOCUMENTS

JP    2001-177064    6/2001

OTHER PUBLICATIONS

Kenichi Ichino et al., "Application of Partially Rotational Scan Technique with Tester IP for Processor Circuits," IEICE Trans. Inf. & Syst., vol. E87-D, No. 3, Mar. 2004, pp. 586-591.
Japanese Office Action, mailed Mar. 4, 2008 and issued in corresponding Japanese Patent Application No. 2005-109537.

* cited by examiner

*Primary Examiner*—Phung M Chung
(74) *Attorney, Agent, or Firm*—Staas & Halsey LLP

(57) ABSTRACT

An object of the invention is to drastically reduce the area overhead in a semiconductor integrated circuit incorporating a test configuration that uses a partially rotational scan circuit. To achieve this, in the semiconductor integrated circuit incorporating the test configuration that comprises a combinational circuit (3) and a scan chain (2) constructed by connecting a plurality of scan flip-flops (5) in a chain, the scan chain (2) is divided into a plurality of sub scan-chains (20a to 20n) each of which has a partially rotational scan (PRS) function and a test response compaction (MISR) function. By performing a scan test in a plurality of steps while changing the combination of the sub scan-chains to be set as PRS and the sub scan-chains to be set as MISR, the test can be performed without having to provide a test response compactor separately from the scan chain, and thus the area overhead can be reduced.

10 Claims, 16 Drawing Sheets

FIRST SELECTOR

SECOND SELECTOR

FIG. 16
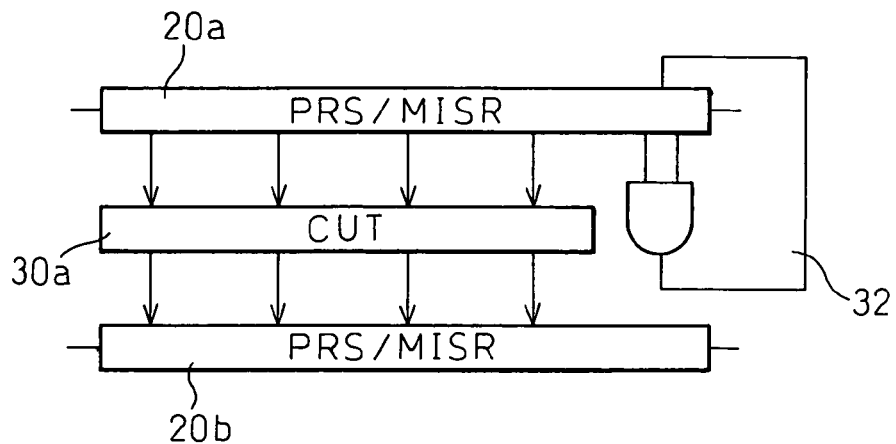
FIG. 17A
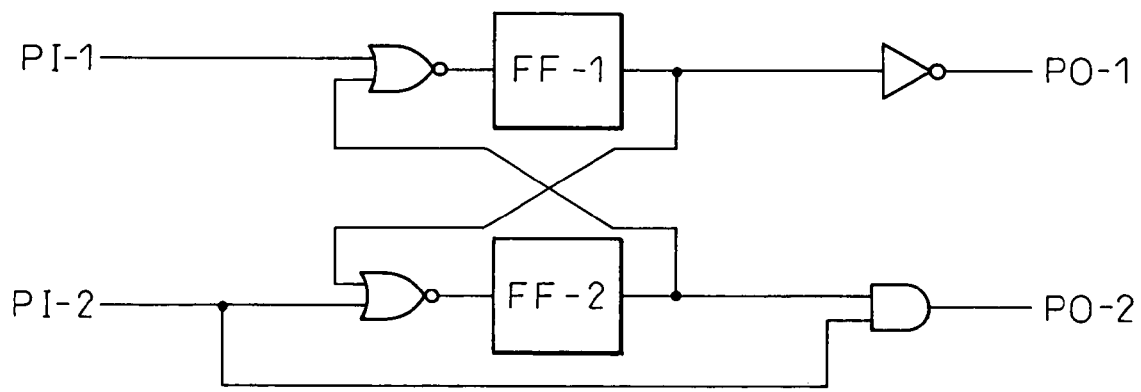
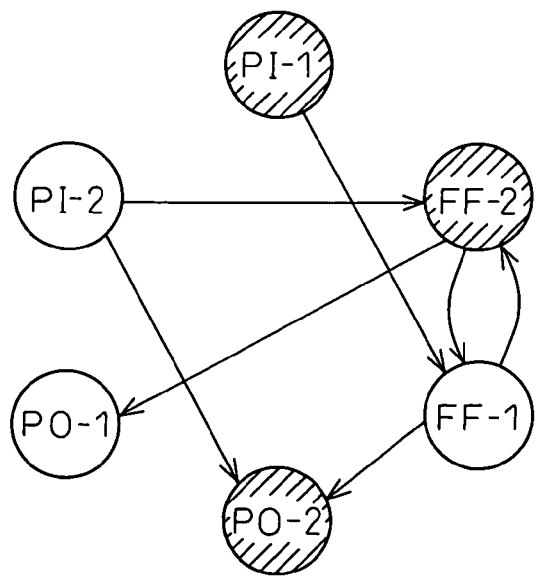
FIG. 17B

SEMICONDUCTOR INTEGRATED CIRCUIT INCORPORATING TEST CONFIGURATION AND TEST METHOD FOR THE SAME

CROSS-REFERENCE TO RELATED APPLICATION

This application claims priority of Japanese Patent Application No. 2005-109537, filed on Apr. 6, 2005.

BACKGROUND OF THE INVENTION

1. Field of the Invention

The present invention relates to a semiconductor integrated circuit designed for testability and to a test method for the same and, more particularly, to a semiconductor integrated circuit incorporating a test configuration having a scan chain constructed by connecting a plurality of scan flip-flops in a chain, and a test method for such a semiconductor integrated circuit.

2. Prior Art

With advances in deep submicron processes and multilayered wiring structures, semiconductor chips such as VLSI devices (very large-scale semiconductor integrated circuit devices) have been greatly improved both in performance and in functionality. On the other hand, the difficulty in testing such VLSI devices has become a major problem. Therefore, in VLSI devices with increased integration and increased operating speed, there has developed a need for detecting new kinds of faults (crosstalk, etc.) at lower cost.

FIG. 1 shows an LSI test method. A stuck-at fault shown in FIG. 1A is a typical VLSI fault model. This fault is a fault that causes the input or output of a device in a circuit to permanently take a logic value 0 or 1. In the example shown here, the output signal line of a NAND gate is in a stuck-at-0 fault condition. When inputs are applied that should cause the NAND gate to output a 1 on the signal line, the internal state of the circuit becomes different from normal. In the illustrated example, the influence of the fault propagates outside the circuit. That is, when a vector {1, 0, 1} is applied, if the output is a 1, this means that the signal line is in a stuck-at-0 fault condition; on the other hand, if the output is 0, this means that the signal line is not in a stuck-at-0 fault condition. Accordingly, the vector {1, 0, 1} is a test vector for detecting a stuck-at-0 fault on the signal line.

With increasing semiconductor integration and process miniaturization, there has been a growing need to detect faults that cannot be detected using single stuck-at fault models only. One technique that is expected to be effective in detecting the so-called "unmodeled faults" is the n-detection test shown in FIG. 1B. The n-detection test is a method that detects a single stuck-at fault by performing the detection a plurality of times using different test vectors. In the illustrated example, three vectors are the test vectors all of which are applied to detect the same fault. With the n-detection test, it becomes possible to detect a fault that could not be detected by a single detection test. The method is also expected to be effective in detecting the so-called "unmodeled faults" such as crosstalk and delay faults.

However, the n-detection test requires the use of many test vectors. In the example of FIG. 1B, three test vectors are applied in order to detect a stuck-at-0 fault. In this way, to perform the n-detection test, the amount of test data increases as the number of detections increases, and a technique for reducing the amount of the test data is essential in order to perform the test efficiently.

Further, the amount of test data and the test time required to test VLSI devices have been increasing year by year. There are cases where the test data generated by an ATPG (Automatic Test Pattern Generator) exceeds the memory capacity of a semiconductor tester. Furthermore, as the operating speeds of VLSI devices increase, there occur cases where tests cannot be done using existing testers. There is therefore a need to test high-speed VLSI devices using low-speed testers.

As one method for performing the n-detection test at low cost, there is proposed a method that uses a partially rotational scan (PRS) circuit (refer to document 1 listed below). The partially rotational scan circuit is a technique employed for design for testability, and makes at-speed testing possible by using a low-speed tester when performing the n-detection test; with this circuit, many shift vectors other than the ATPG vectors can be generated by partially rotating the scan chain. Using these shift vectors, the amount of test data can be reduced. Since the test data need not be scanned in during the rotation operation, at-speed testing can be performed using a low-speed tester.

To fabricate a VLSI device incorporating a test configuration that uses the partially rotational scan circuit, a test response compactor for extracting responses from the circuit-under-test (CUT) must be added to the circuit-under-test in addition to the partially rotational scan circuit that generates test patterns. A multiple-input signature register (MISR) is often used as the test response compactor.

FIG. 2 shows an LSI test configuration that uses the partially rotational scan (hereinafter abbreviated PRS) circuit. In the figure, reference numeral 1 is a tester which generates test vectors, 2 is the PRS circuit, 3 is the circuit-under-test (hereinafter abbreviated CUT), and 4 is a MISR as the test response compactor. The PRS circuit 2, the CUT 3, and the MISR 4 are integrated as a single LSI device. The test vectors generated by the tester 1 are input to the PRS circuit 2 which then generates shift vectors and rotation vectors, thereby making it possible to reduce the amount of the test data. Accordingly, a low-speed tester can be used as the tester 1. Test results are compacted by the MISR 4, and output from the integrated circuit device.

(Document 1) "Application of Partially Rotational Scan Technique with Tester IP for Processor Circuits," IEICE Trans. Inf. & Syst., Vol. E87-D, No. 3, pp. 586-591 (Mar. 2004), Kenichi Ichino, Ko-ichi Watanabe, Masayuki Arai, Satoshi Fukumoto, and Kazuhiko Iwasaki.

In the integrated semiconductor circuit incorporating the test configuration that uses the PRS circuit shown in FIG. 2, as the PRS circuit 2 generates the rotation vectors by performing the rotation operation with the shift vectors input thereto, the results of the testing of the CUT 3 cannot be held therein, unlike the conventional scan circuit. Accordingly, the MISR circuit 4 is added to hold the test results. However, the addition of the MISR circuit 4 results in a corresponding increase in the VLSI circuit area. Furthermore, selectors, etc. added in the PRS circuit 2 also increase the circuit area, and as a result, this test configuration has the shortcoming that area overhead significantly increases compared with the conventional scan-type test configuration. Accordingly, in the test configuration that uses the PRS circuit, a major technical challenge is how the area overhead can be reduced in the fabrication of the semiconductor device.

SUMMARY OF THE INVENTION

The present invention has been devised in view of the above problem, and an object of the invention is to provide a semiconductor integrated circuit having a novel test configuration that can drastically reduce the area overhead by redesigning the PRS circuit and the MISR circuit, and a test method for such a semiconductor integrated circuit.

According to a first invention that solves the above problem, there is provided a semiconductor integrated circuit incorporating a test configuration that comprises a combinational circuit and a scan chain constructed by connecting a plurality of scan flip-flops in a chain, wherein the scan chain is divided into a plurality of sub scan-chains and each has a partially rotational scan function and a test response compaction function.

The semiconductor integrated circuit according to the first invention further comprises selecting means for selecting the function of each of the sub scan-chains independently of each other, wherein, under control of the selecting means, each sub scan-chain selects either the partially rotational scan function or the test response compaction function, and performs the selected function.

According to a second invention that solves the above problem, there is provided a test method for a semiconductor integrated circuit incorporating a test configuration that comprises a combinational circuit and a scan chain constructed by connecting a plurality of scan flip-flops in a chain, the scan chain being divided into a plurality of sub scan-chains each of which has a partially rotational scan function and a test response compaction function, wherein a first scan test is conducted by causing at least one of the plurality of sub scan-chains to perform the partially rotational scan function while causing the other sub scan-chains to perform the test response compaction function and, after completion of the first scan test, at least a second scan test is conducted by interchanging the combination of the sub scan-chains that perform the partially rotational scan function and the sub scan-chains that perform the test response compaction function.

In the second invention, the first scan test is conducted by setting one half of the plurality of sub scan-chains to perform the partially rotational scan function and the other half thereof to perform the test response compaction function, and the second scan test is conducted by interchanging the functions of the sub scan-chains.

Further, in the second invention, the first and second scan tests are each conducted by using all of the test vectors.

According to a third invention that solves the above problem, there is provided a semiconductor integrated circuit incorporating a test configuration that comprises a combinational circuit and a scan chain constructed by connecting a plurality of scan flip-flops in a chain, wherein the scan chain is divided into a plurality of sub scan-chains each of which contains L rotation blocks (L is a natural number not smaller than 1) each comprising m flip-flops (m is a natural number not smaller than 2) and m selectors each preceding a corresponding one of the m flip-flops, and wherein a foremost one of the selectors in a foremost one of the L rotation blocks selects for output either an externally applied test vector or an output of the combinational circuit or an output of an endmost one of the flip-flops in the foremost rotation block, a foremost one of the selectors in each of the rotation blocks other than the foremost block selects for output either an output of its preceding rotation block or an output of the combinational circuit or a sum of the output of the preceding rotation block and the output of the combinational circuit or an output of an endmost one of the flip-flops in the current rotation block, and each of the other selectors selects for output either an output of its preceding flip-flop or an output of the combinational circuit or a sum of the output of the preceding flip-flop and the output of the combinational circuit.

In the third invention, the sum is produced by an exclusive-OR gate.

In the third invention, the foremost selector in the foremost rotation block is further supplied with a flip-flop output obtained from an endmost one of the rotation blocks in the sub scan-chain.

In the semiconductor integrated circuit incorporating the test configuration according to the present invention, the scan chain comprising the plurality of scan flip-flops is divided into a plurality of sub scan-chains each of which has a partially rotational scan function and a test response compaction function. Accordingly, when testing the semiconductor integrated circuit, a scan test can be performed by implementing the partially rotational scan function using any one of the sub scan-chains while implementing the test response compaction function using the other sub scan-chain.

In the test configuration using the prior art partially rotational scan circuit that has only the partially rotational scan function, a test response compactor has had to be provided in order to hold the test results; on the other hand, in the semiconductor integrated circuit of the present invention, there is no need to provide a test response compactor separately, since each sub scan-chain is equipped with both functions. The scan chain and the test response compactor each require the provision of a flip-flop array comprising a plurality of flip-flops connected in cascade; here, if the flip-flops in one flip-flop array are configured to have both the scan function and the test result holding function, the other flip-flop array can be omitted. Since the amount of additional circuitry that is needed to omit the other flip-flop array is small, the area overhead associated with the test configuration can be greatly reduced.

Further, a selecting means is provided that controls each sub scan-chain to operate by selecting either the partially rotational scan function or the rest response compaction function; here, by controlling the selecting means by an external signal, the function of the sub scan-chain can be easily changed. This facilitates implementing various test methods.

For example, as shown in the second invention, by conducting, after completion of the first scan test, a second scan test by interchanging the combination of the sub scan-chains that perform the partially rotational scan function and the sub scan-chains that perform the test response compaction function, the fault coverage of the scan testing can be increased.

Further, if the selecting means is set so that, of the plurality of sub scan-chains, one sub scan-chain in each pair of adjacent sub scan-chains is set to implement the partially rotational scan function while setting the other sub scan-chain in each pair to implement the test response compaction function and, in this condition, the first scan test is conducted which is followed by the second scan test by interchanging the functions of the sub scan-chains, then all the combinational circuits can be tested in two steps of testing.

According to the third invention, the semiconductor integrated circuit can be configured efficiently.

BRIEF DESCRIPTION OF THE DRAWINGS.

FIG. 16 is a diagram for explaining how the division of a scan chain affects fault propagation.

FIG. 17A is a diagram for explaining a scan-chain dividing algorithm.

FIG. 17B is a diagram for explaining the scan-chain dividing algorithm.

DESCRIPTION OF THE PREFERRED EMBODIMENTS

Before describing the configuration of the present invention, the configuration and operation of the previously proposed PRS circuit 2 and the MISR circuit 4 will be described with reference to FIGS. 3 to 6.

The conventional scan design mainly comprises the functions of registers. The PRS circuit is constructed by extending the conventional scan design and incorporating the partially rotational function in addition to the register function. When the rotational function is not used, the function that the circuit provides is the same as that of the conventional scan circuit.

The PRS circuit comprises circuits called rotation blocks (RBs) one for each rotation unit. Each rotation block has the same rotation bit width. Whether the scan circuit performs the shift operation or the rotation operation can be controlled by a selecting means, for example, a multiplexer (MUX), provided in the rotation block.

Figure 1A:
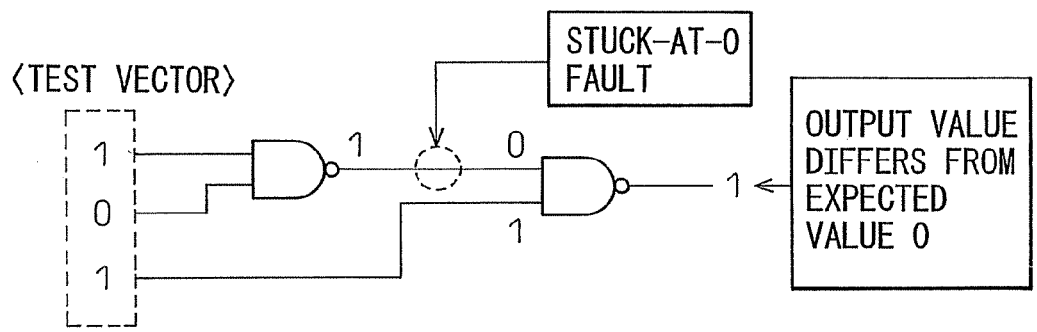
FIG. 1A is a diagram for explaining an LSI test method for a stuck-at fault.
Figure 1B:
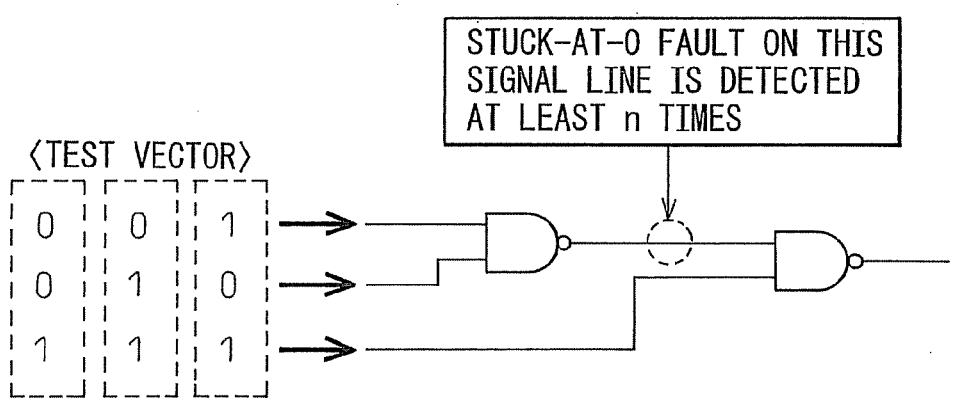
FIG. 1B is a diagram for explaining an LSI test method for an n-detection test.
Figure 2:
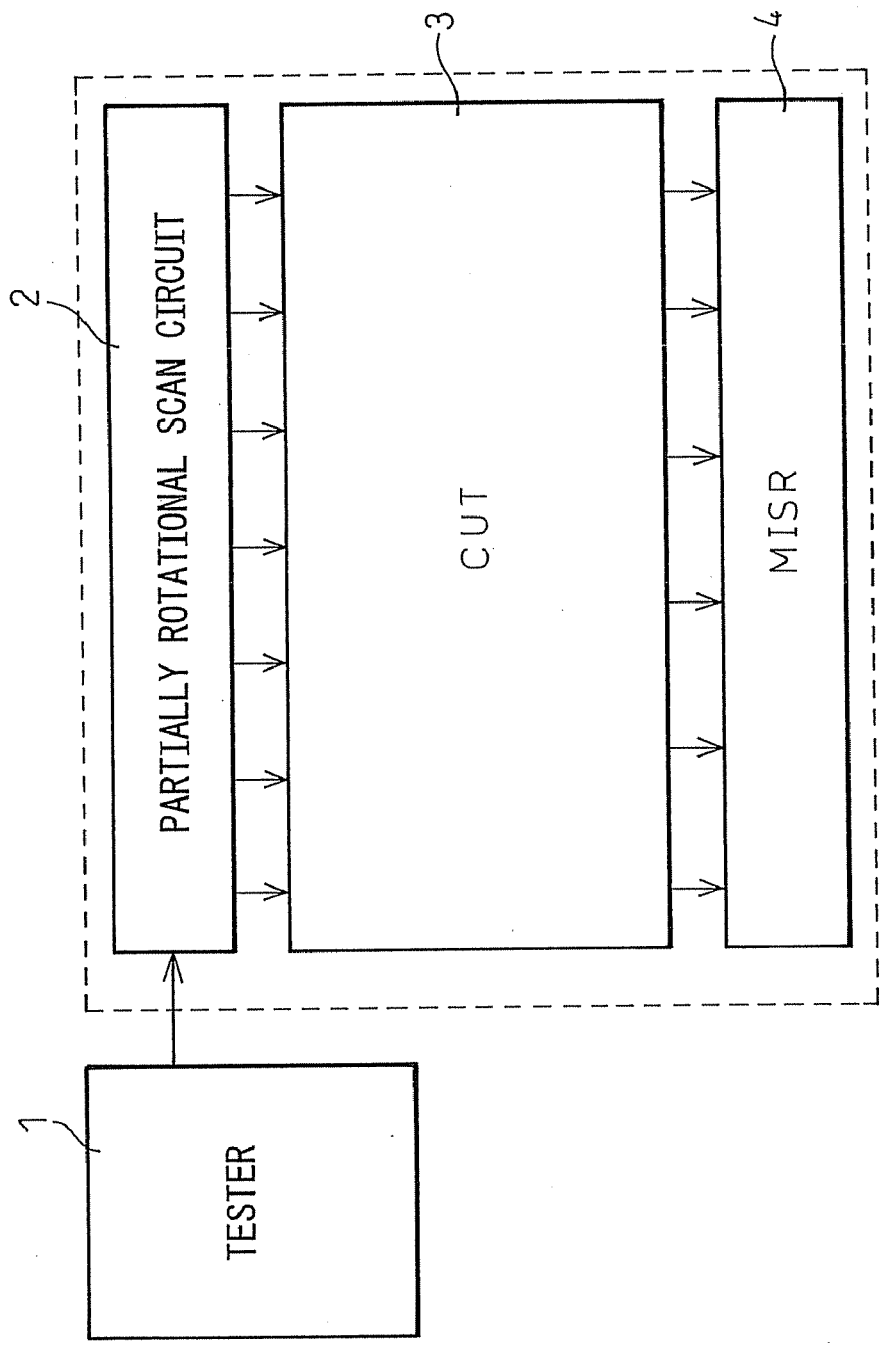
FIG. 2 is a diagram showing a semiconductor integrated circuit test configuration that uses a partially rotational scan circuit.
Figure 3:
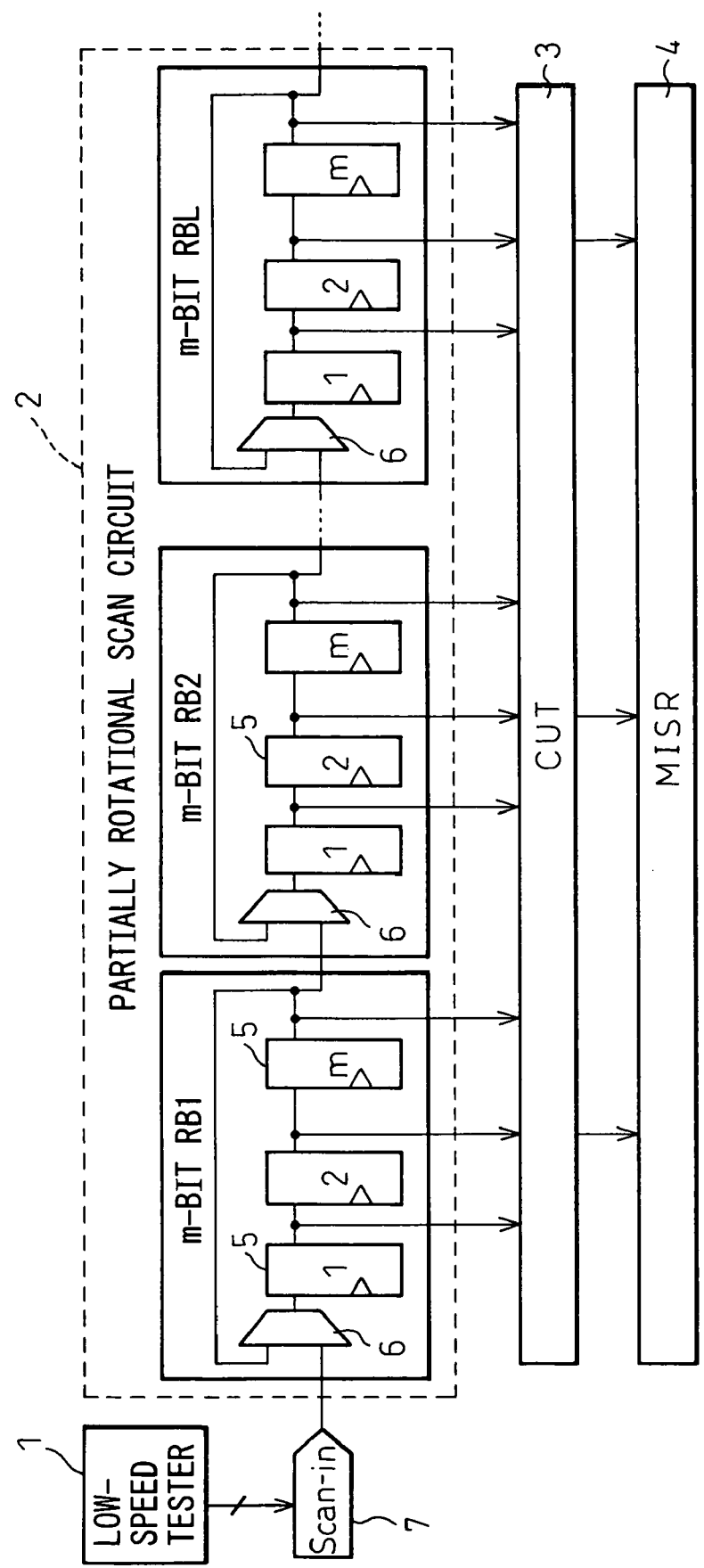
FIG. 3 is a diagram showing the configuration of the partially rotational scan circuit.

FIG. 3 shows one example of the PRS circuit. In this example, L m-bit RBs (RB1 to RBL) are connected in cascade. Each RB comprises m flip-flops 5 connected in cascade and a selector 6 constructed from an MUX or the like. Based on an external control signal, the selector 6 controls whether the RB is to perform the scan circuit operation or the rotation operation. In the circuit shown here, test vectors can be applied to the Lxm-bit input CUT 3. For the PRS circuit 2 to output test vectors, a test bit sequence must be scanned in. The test bit sequence is input bit by bit from a scan-in 7 to the PRS circuit 2.

The PRS circuit 2 operates as follows. First, each RB performs rotation by an amount equal to the bit width m. That is, the rotation is repeated until the state returns to the same state as before the rotation started. Next, all the flip-flops 5 are shifted by one bit. At the same time, one-bit data is loaded from the scan-in 7. This operation is repeated until all the bits in the test bit sequence are scanned in. That is, one-bit data is loaded from the scan-in once in every (1+m) clocks. New test bits need not be applied during the rotation. That is, it is only necessary to apply one bit while the CUT 3 operates for (1+m) clocks. This provides the potential of being able to perform at-speed testing using a tester with a speed lower than would be the case with the method using the conventional scan circuit.

Figure 4:
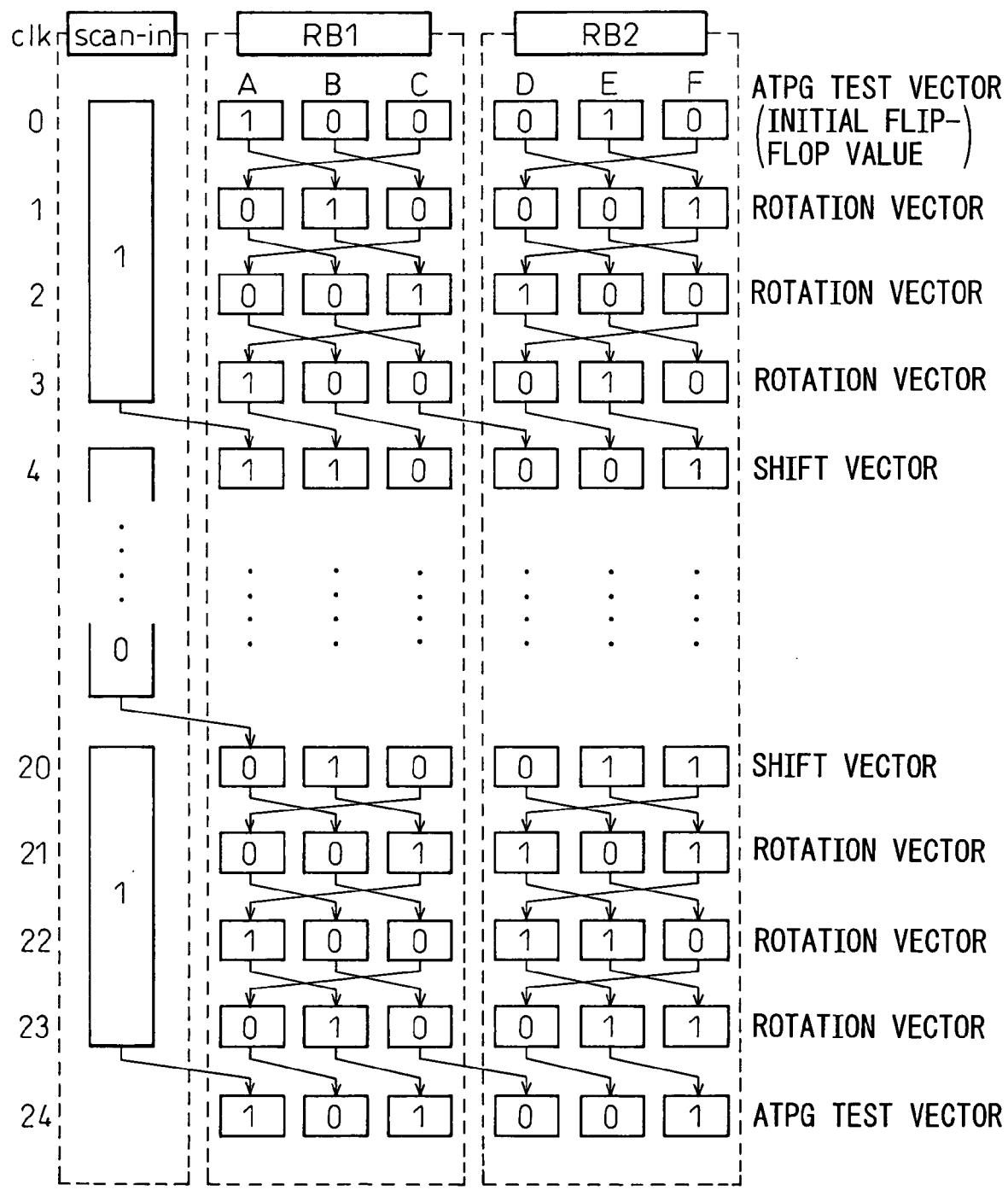
FIG. 4 is a time chart for explaining the operation of the partially rotational scan circuit.

FIG. 4 shows an operational example of the PRS circuit 2. A PRS circuit constructed by connecting two 3-bit RBs in cascade is considered here. Scan-in indicates the test vector to be scanned in. A, B, and C indicate the values of the flip-flops in the rotation block RB1, and D, E, and F indicate the values of the flip-flops 5 in the rotation block RB2. The time progresses from the top toward the bottom of the figure. First, attention is paid to the operation of the RB1. At clk=0, ABC="100" is installed as the initial value. When the first clock is applied, the RB1 rotates to the right, and hence ABC="010". This operation is called the rotation operation of the RB. Here, ABC="010" is applied to the CUT. With the second and third clocks, the RB1 rotates to ABC="001" and ABC="100", respectively, which are sequentially applied to the CUT. Here, with the third clock, the value returns to the initial value. When the fourth clock is applied, the scan-in is connected to the output of the selector 6, and hence ABC="110". This is the shift operation of the RB.

The test bit sequence is a set of several ATPG test vectors. The PRS circuit applies every ATPG test vector forming the test bit sequence to the CUT 3. During the interval between the time that one ATPG test vector is applied and the time that the next ATPG test vector appears, several test vectors are generated by the shift and rotation operations. The vectors generated by the shift operation are called the shift vectors. Likewise, the vectors generated by the rotation operation are called the rotation test vectors. These test vectors can be expected to have the effect similar to that of pseudo-random test vectors generated by an LFSR. That is, these test vectors are used to detect "easy-to-detect faults" that account for the vast majority of a fault set. Difficult-to-detect faults are detected using the ATPG test vectors forming the test bit sequence.

The number of rotation test vectors generated by the PRS circuit depends on the rotation bit width m. The number of rotation test vectors affects the test data compaction and the test time. Increasing the rotation bit width m means increasing the number of rotation test vectors. By so doing, the interval at which the test data is applied from the tester can be made longer, making it easier to perform at-speed testing using an even slower speed tester. On the other hand, as the number of rotation test vectors increases, it is highly likely that the size of the test bit sequence required to achieve 100% fault coverage will decrease.

When the PRS circuit is used as the scan circuit, as described above, the test is performed in accordance with a test-per-clock scheme. Accordingly, the PRS circuit must hold an arbitrary value and cannot be used as a test response compactor for capturing test responses. As a result, in the semiconductor integrated circuit device having the prior art test configuration that uses the PRS circuit, a test response compactor, such as an MISR, for holding the test results must be provided separately from the PRS circuit. However, many additional circuits are needed to construct the PRS circuit and the MISR circuit. The resulting increase in area overhead is a major problem facing the designer of the semiconductor integrated circuit device having the test configuration that uses the PRS circuit.

Figure 5:
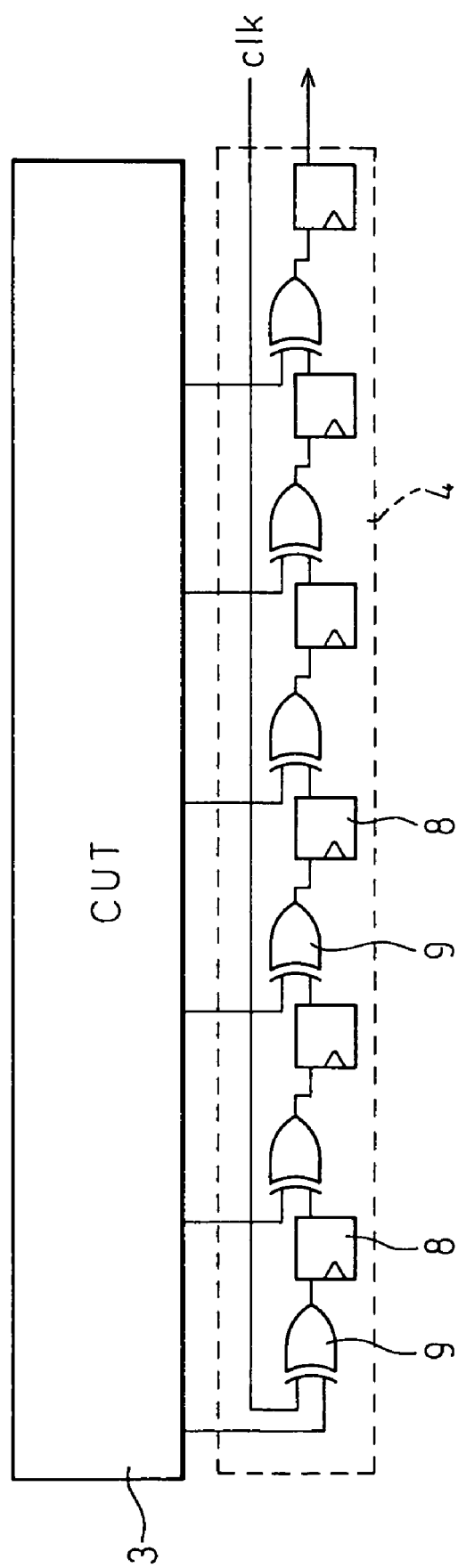
FIG. 5 is a diagram showing the configuration of a MISR circuit.

FIG. 5 shows one example of the MISR circuit 4. The MISR circuit 4 basically comprises a plurality of flip-flops 8 and an equivalent number of XOR (exclusive-OR) gates 9, and has the function of summing and reducing the amount of the test response results of the CUT 3. The MISR circuit 4 shown here employs a scheme in which the number of inputs of the MISR circuit 4 is the same as the number of outputs of the CUT 3 (1:1 scheme), and requires the same number of flip-flops as the number of outputs of the CUT 3; this increases the area overhead.

Figure 6:
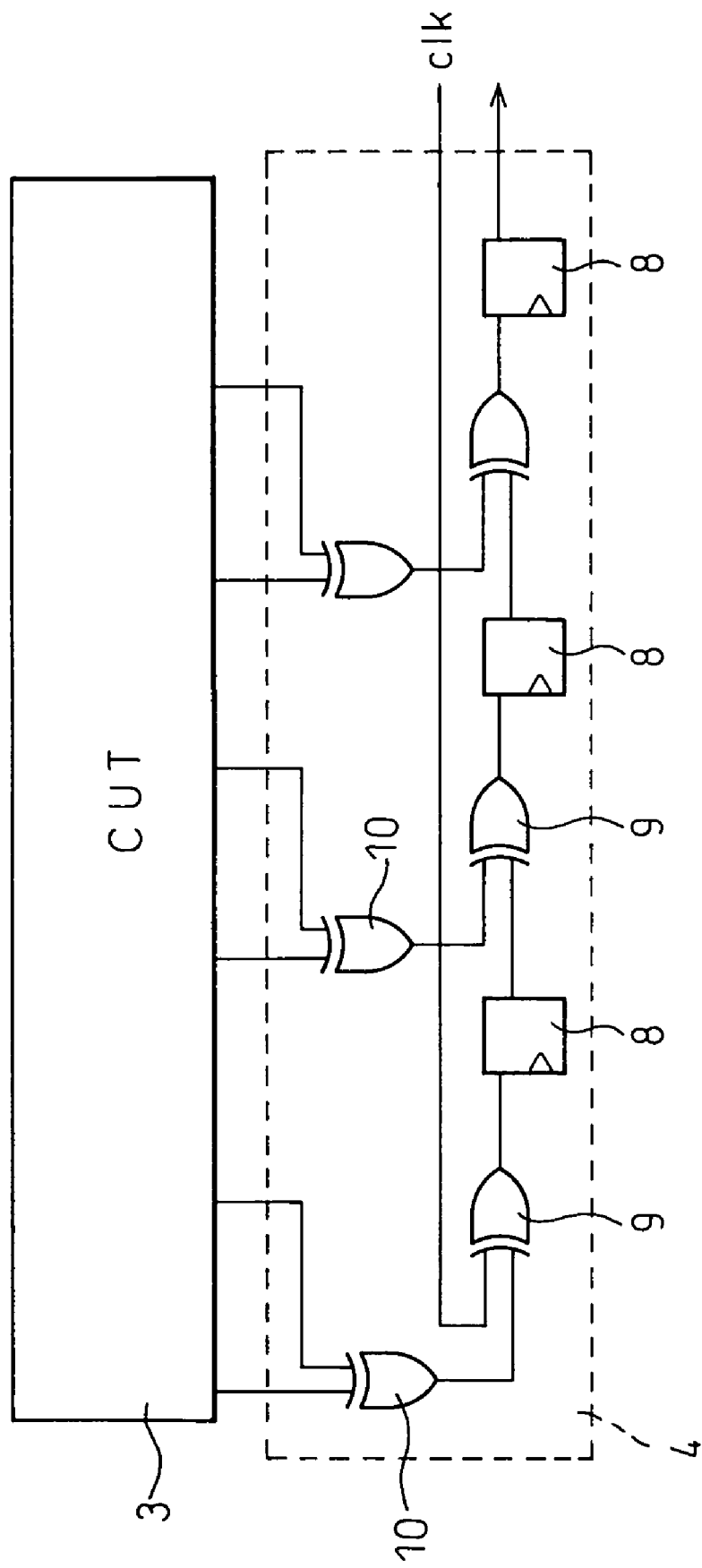
FIG. 6 is a diagram showing an alternative configuration of the MISR circuit.

FIG. 6 shows another example of the MISR circuit 4. In this example, the number of inputs to the MISR circuit is reduced by one half by using one 2-input XOR gates 10 for two outputs of the CUT 3. As a result, the number of flip-flops 8 required is one half the number of outputs of the MISR circuit. Likewise, by using three 2-input XOR gates 10, a ¼ scheme MISR circuit is constructed, and by using seven 2-input XOR gates 10, a ⅛ scheme MISR circuit is constructed. While such MISR circuits can reduce the area overhead by reducing the number of flip-flops, the disadvantage is that the fault aliasing probability increases, as the number of MISR inputs is reduced.

An object of the present invention is to reduce the area overhead associated with the partially rotational scan circuit. As a technique for achieving this, the present invention proposes to redesign the PRS and the MISR. In the prior art method, the PRS and the MISR are constructed separately but, by implementing both the PRS and MISR functions on a single scan chain, as proposed in the present invention, the area overhead can be reduced. However, in the prior art method, since the PRS is constructed from a single scan chain, if the MISR function is added to this scan chain, the test-per-clock test scheme cannot be implemented. In view of this, in the present invention, the scan chain is divided into a plurality of sub scan-chains, and the test-per-clock testing is made possible by setting some sub scan-chains as the PRS and others as the MISR. When constructing the sub scan-chains, a primary input (PI) for inputting a test vector directly from a tester, a primary output (PO) as a scan chain output, and a flip-flop (FF) must be included in each sub scan-chain.

Figure 7:
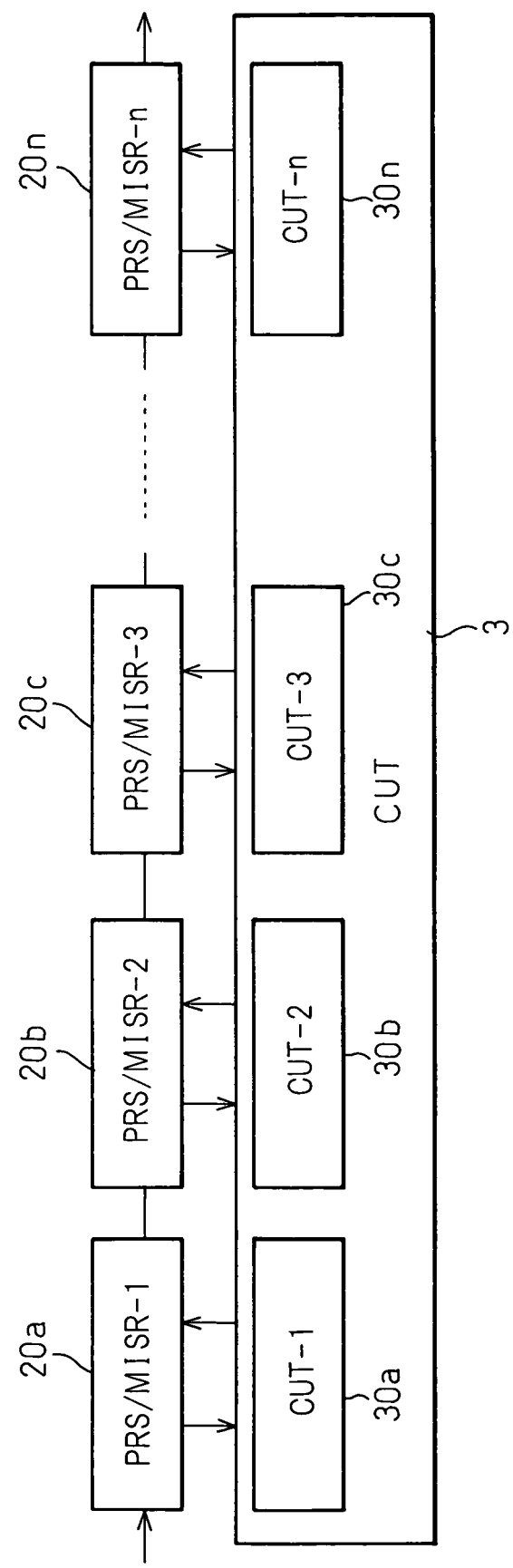
FIG. 7 is a diagram showing a test configuration according to one embodiment of the present invention.

FIG. 7 shows an outline of the configuration of the semiconductor integrated circuit according to the present invention. In the prior art, a single scan chain has been constructed for the CUT 3, but in the present invention, a single scan chain is divided into a plurality of sub scan-chains 20 (20a, 20b, 20c, . . . , 20n). With this division, the CUT 3 is divided into a plurality of sub-CUTs 30 (30a, 30b, 30c, . . . , 30n). Each sub scan-chain has both the PRS and MISR functions.

When performing an actual test, each sub scan-chain 20 is controlled by an external signal whether it performs as a PRS circuit or as a MISR circuit. For example, the sub scan-chain 20a is set as a PRS circuit and supplies a test pattern to the sub-CUT 30a, while at the same time, the sub scan-chain 20b is set as a MISR circuit and holds the test result. In this way, the sub-CUT 30a can be tested.

Figure 8:
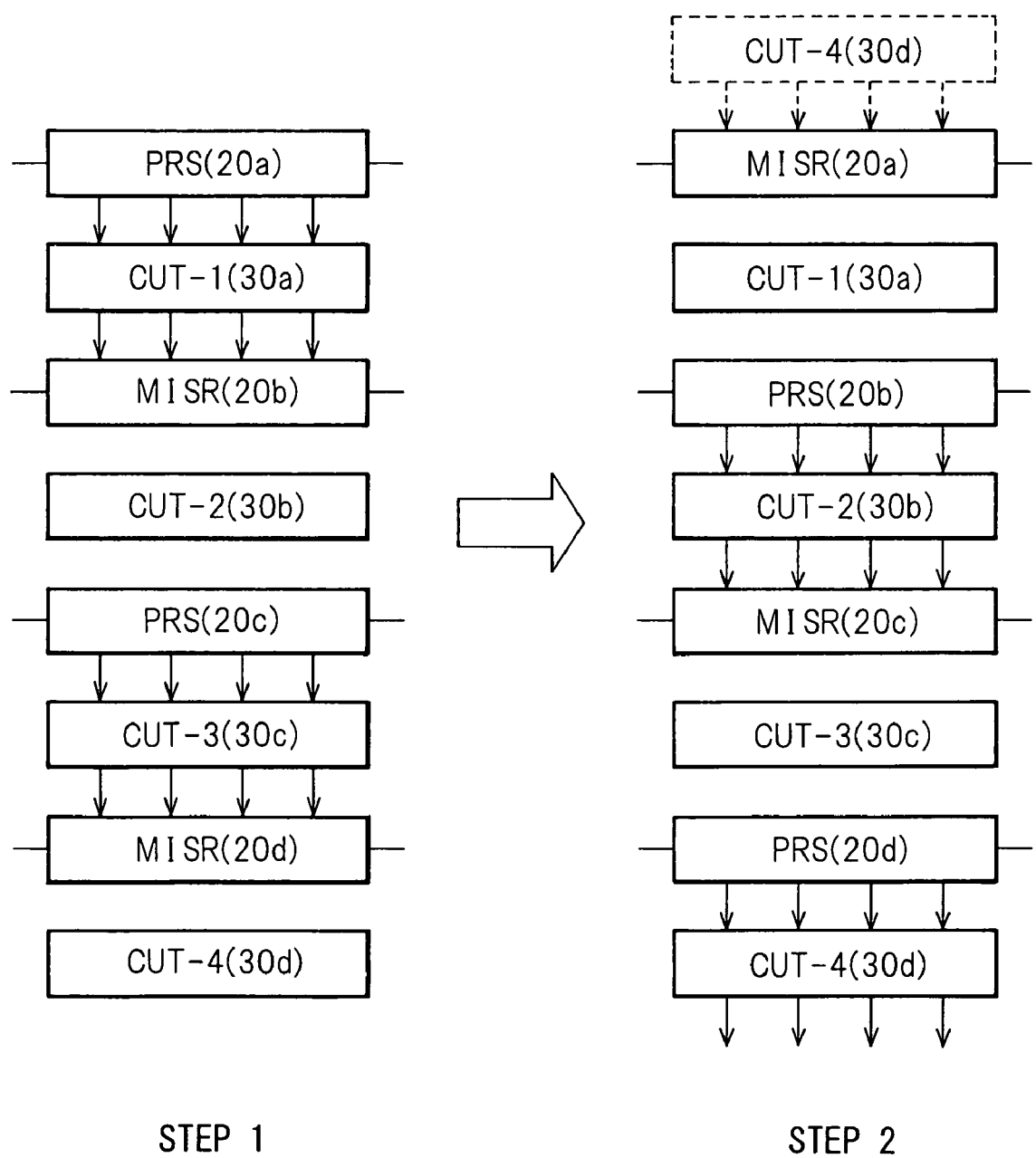
FIG. 8 is a diagram showing a test schedule according to the one embodiment of the present invention.

FIG. 8 shows one example of a test schedule when the circuit of FIG. 7 is used. In the illustrated example, two of the four sub scan-chains 20 are set as PRS and the other two as MISR. More specifically, in step 1, the sub scan-chain 20a is set as PRS, the sub scan-chain 20b as MISR, the sub scan-chain 20c as PRS, and the sub scan-chain 20d as MISR. In this condition, a test vector is scanned into the sub scan-chain 20a operating as PRS. In this way, the sub-CUT-1 (30a) and the sub-CUT-2 (30b) are tested.

When all the test vectors have been scanned in, the combination of PRS and MISR is interchanged, and the same operation is repeated. That is, in step 2, the sub scan-chain 20a is set as MISR, the sub scan-chain 20b as PRS, the sub scan-chain 20c as MISR, and the sub scan-chain 20d as PRS, and a test vector is scanned into each PRS. In this way, the sub-CUT-2 (30b) and the sub-CUT-4 (30d) are tested, completing the testing of all the sub-CUTs, that is, the scan test of the CUT 3 is completed.

According to the test schedule shown in FIG. 8, the time required to test the CUT 3 doubles compared with the time required in the prior art scan test method but, since the MISR circuit 4 required with the prior art method can be eliminated, the area overhead is about 5%. Each sub scan-chain 20 includes rotation blocks (RBs) corresponding to the PI (primary input), the PO (primary output), and the FF (flip-flop), respectively. Accordingly, the vector to be shifted into the PRS is generated so that the positions of the PI and FF match the PI and FF positions of the vector to be shifted in. When the sub scan-chain 20 operates as MISR, and as it contains the rotation blocks (RB) corresponding to the PI, the PO, and the FF, respectively, a random pattern generated by capturing responses is used as the pattern generated from the PI and FF of the MISR.

Figure 9:
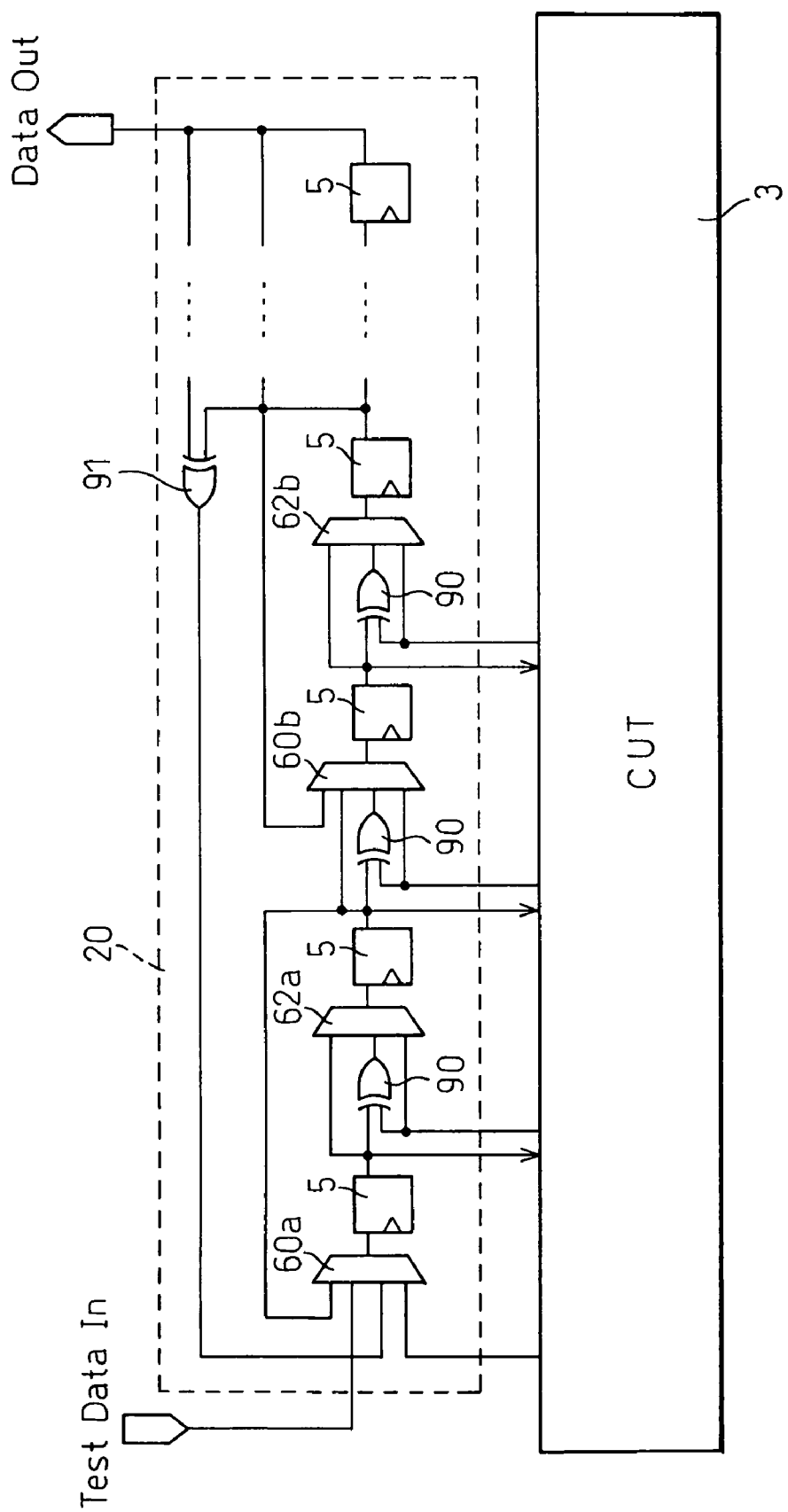
FIG. 9 is a diagram showing the configuration of a sub scan-chain according to the one embodiment of the present invention.

FIG. 9 shows the configuration of the sub scan-chain 20 according to one embodiment of the present invention. The sub scan-chain 20 shown here comprises, for example, k RBs each having a rotation width of 2 (two flip-flops 5). Each RB comprises two flip-flops 5, a first selector 60 (60a, 60b, . . . ), a second selector 62 (62a, 62b, . . . ), and an XOR (exclusive-OR) gate 90 for test response compaction. Here, when the rotation width is n, each RB comprises n flip-flops 5, n XOR gates 90, one first selector 60 (or 62), and (n−1) second selectors 62.

In the embodiment shown in FIG. 9, the rotation block comprising the selectors 60a and 60b and two flip-flops 5 forms the primary input and, therefore, the selector 60a is provided with a terminal at which the test data is directly input; on the other hand, the test data from the preceding rotation block is shifted into the first selector 60b of each of the other rotation blocks.

Figure 10A:
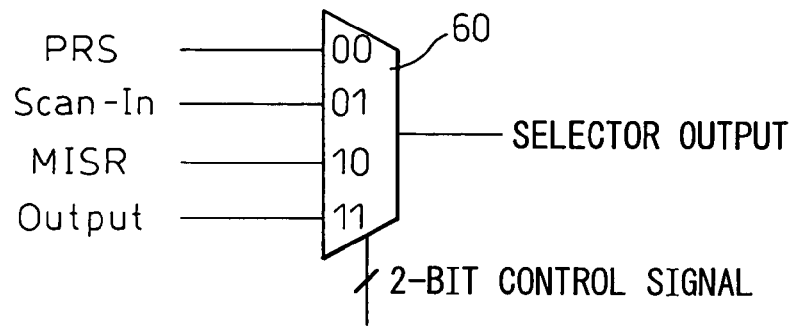
FIG. 10A is a diagram showing the control configuration of a first selector.

FIG. 10 shows the configuration of the first selector 60 and the second selector 62. As shown in FIG. 10A, when, for example, a 2-bit control signal is applied, the first selector 60 selects one of four inputs for output. The inputs are: the signal (designated by PRS in the figure) fed back from the flip-flop 5 in the endmost RB when the sub scan-chain is operating as PRS; the test vector (designated by Scan-In in the figure); the signal (designated by MISR in the figure) fed back from the flip-flop in the final stage of the sub scan-chain 20 when the sub scan-chain is operating as MISR; and the output signal (designated by Output in the figure) from the CUT 3.

Here, when the first selector 60 is one (for example, the selector 60b) contained in a rotation block other than the foremost rotation block in the sub scan-chain 20, the output of the preceding rotation block is input to it instead of the Scan- In. Further, for the MISR input, the result of the half addition between the output of the final flip-flop in the preceding rotation block and the output of the CUT 3 is input via the XOR gate 90.

Figure 10B:
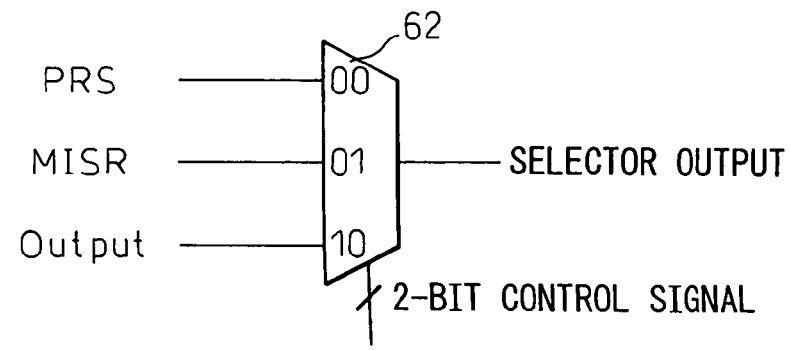
FIG. 10B is a diagram showing the control configuration of a second selector.

On the other hand, as shown in FIG. 10B, the output (designated by PRS in the figure) of the flip-flop 5 in the preceding stage, the result of the half addition (designated by MISR in the figure) taken between the output of the flip-flop 5 in the preceding stage and the output of the CUT 3 and output via the XOR gate 90, and the output (designated by Output in the figure) of the CUT 3 are input to the second selector 62 (62*a*, 62*b*, . . . ) for selection. The selection is made under the control of an external signal.

Figure 11:
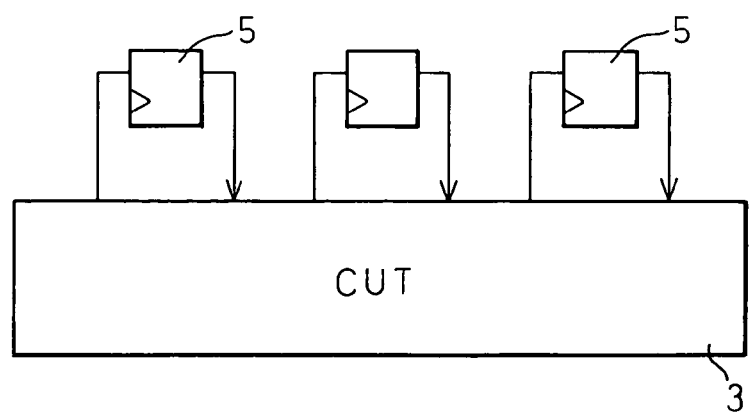
FIG. 11 is a diagram showing the circuit configuration of the sub scan-chain when in normal operation mode.

When the Output input shown in FIG. 10A or 10B is selected by the selector 60 or 62, the semiconductor integrated circuit is operating in the normal operation mode, not in the test mode. In this case, as the first and second selectors 60 and 62 select the Output for output, the respective flip-flops 5 are isolated from the test circuit and allowed to operate as normal flip-flops. FIG. 11 shows the connection configuration of the flip-flops in the normal operation mode.

In the circuit configuration shown in FIG. 9, the output of the flip-flop 5 in the final stage of the sub scan-chain 20 is fed back as the MISR input to the first selector 60*a* that functions as the PI; this arrangement is employed to improve the fault coverage, but need not necessarily be employed when a different compaction scheme is used. Further, the XOR gate 91 shown in FIG. 9 is provided to improve the fault coverage, but this also need not necessarily be provided.

Figure 12:
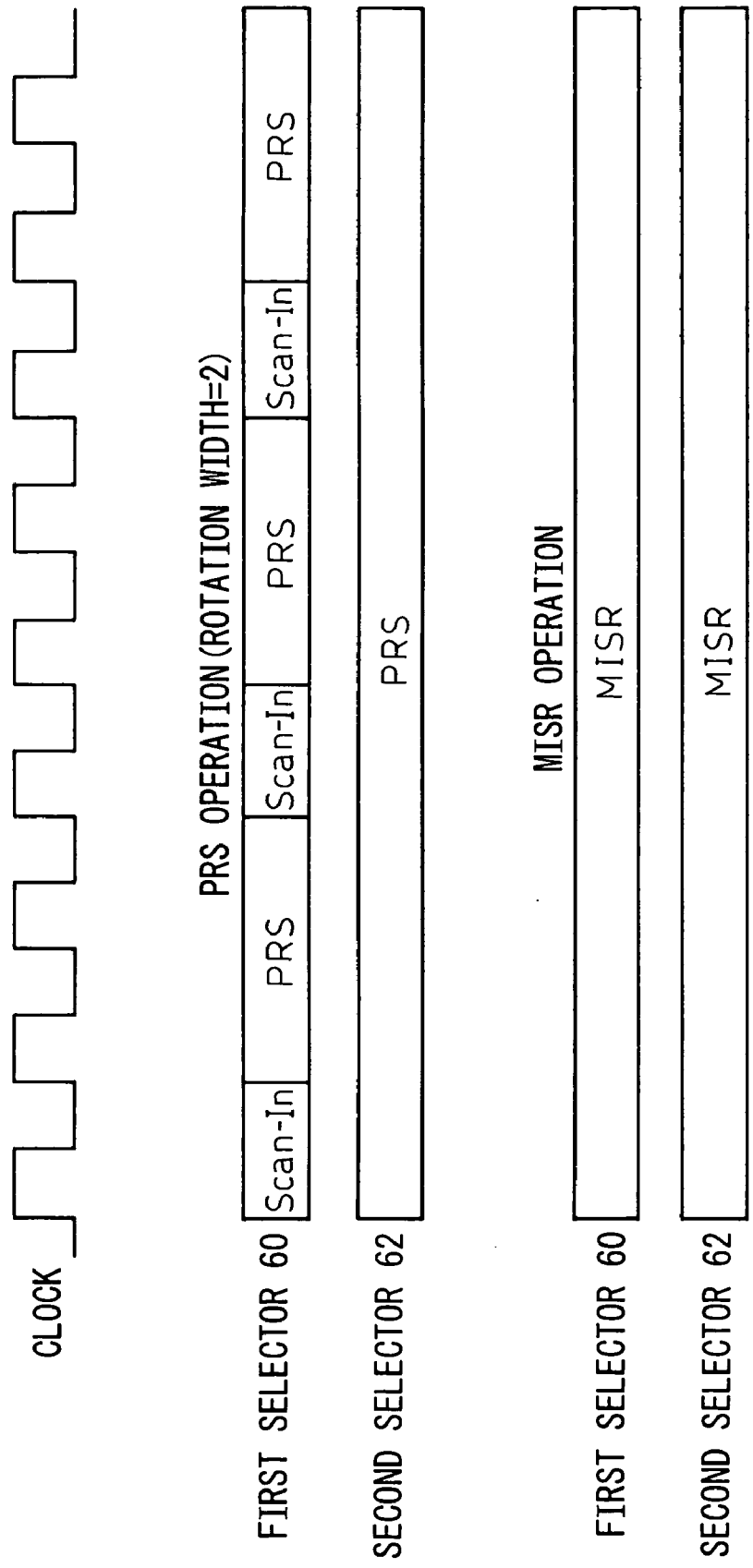
FIG. 12 is a time chart for explaining the operation of the selectors shown in FIG. 9.

FIG. 12 shows a time chart of a selector control signal in scan test mode. When the sub scan-chain 20 is set so as to perform the PRS operation, the first selector 60 selects the test vector (Scan-In) input and the rotation signal (PRS) alternately for output. In this case, the second selector 62 is controlled so as to always perform the rotation operation. On the other hand, when the sub scan-chain 20 is set so as to perform the MISR operation, the first and second selectors 60 and 62 are both set so as to always select the signal MISR.

Figure 13:
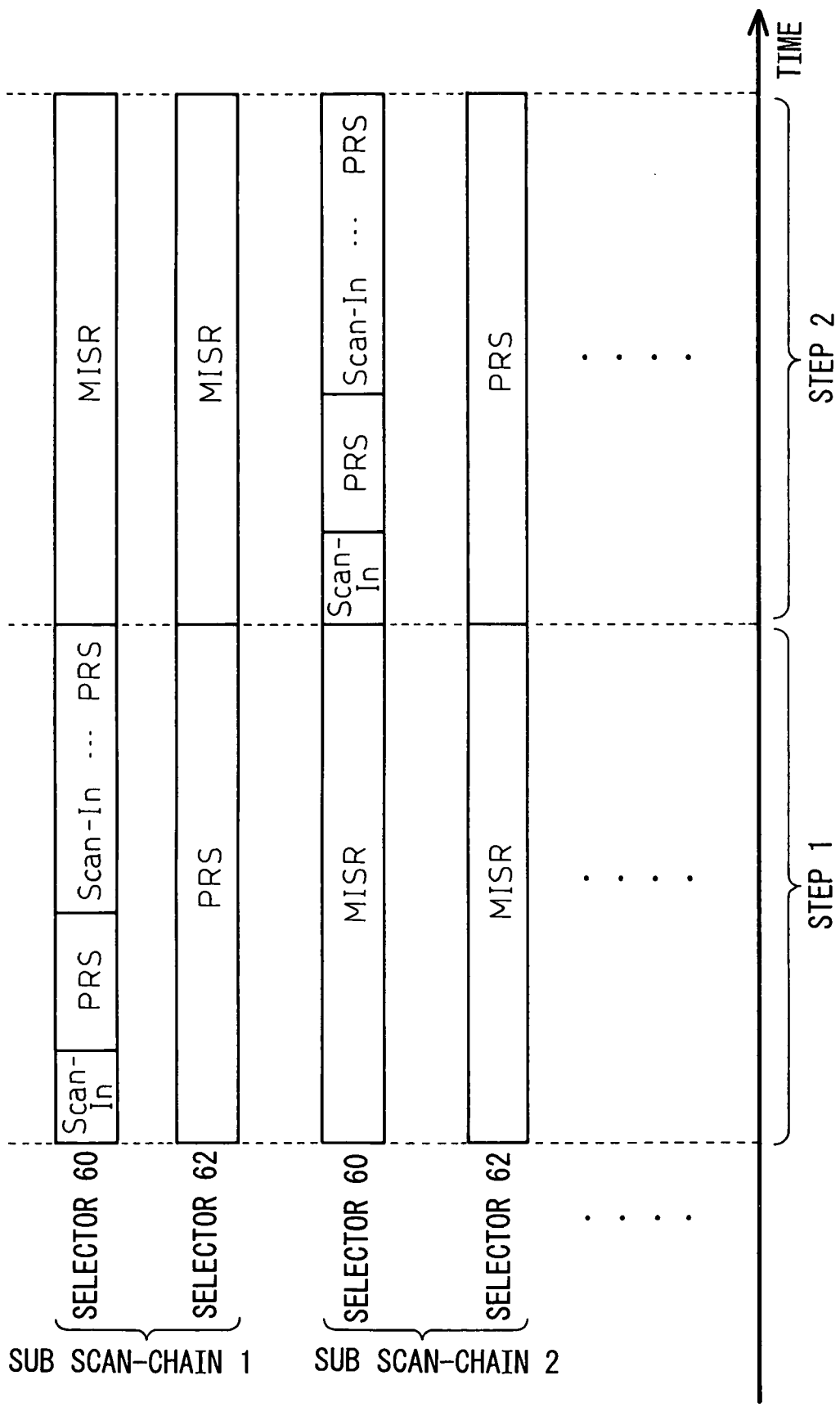
FIG. 13 is a time chart for explaining the operation of the selectors in sub scan-chains 1 and 2.

FIG. 13 shows the operation of each selector in the sub scan-chains 1 and 2. Suppose that, in step 1, the sub scan-chain 1 is set to perform the PRS operation and the sub scan-chain 2 to perform the MISR operation. In the next step 2, the sub scan-chain 1 is set to perform the MISR operation and the sub scan-chain 2 to perform the PRS operation. During the period of step 1, the selector 60 in the sub scan-chain 1 repeatedly selects Scan-In and PRS in alternating fashion, while the selector 62 always selects PRS.

In the next step 2, as the sub scan-chain 1 is set to perform the MISR operation and the sub scan-chain 2 to perform the PRS operation, the selectors 60 and 62 in the sub scan-chain 1 select the signal MISR for input while, on the other hand, in the sub scan-chain 2 the selector 60 repeatedly selects Scan-In and PRS in alternating fashion and the selector 62 always selects PRS.

Figure 14:
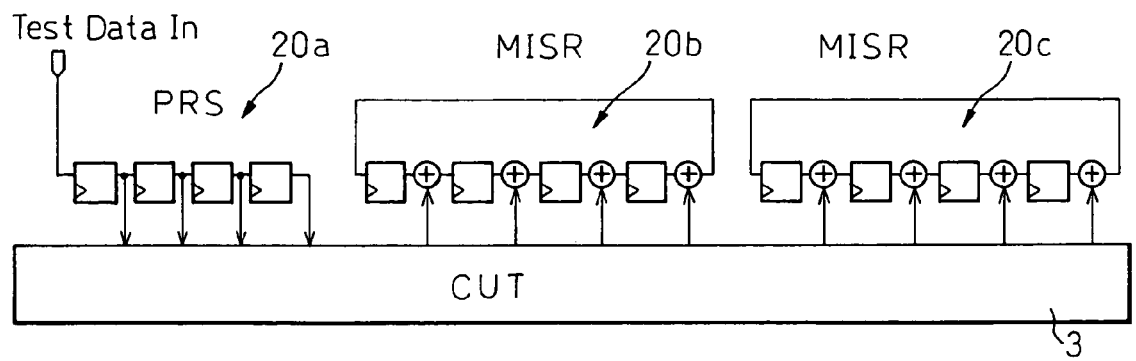
FIG. 14A is a diagram showing the setting of the sub scan-chains at a first given time.
FIG. 14B is a diagram showing the setting of the sub scan-chains at a second given time.
FIG. 14C is a diagram showing the setting of the sub scan-chains at a third given time.
Figure 14:
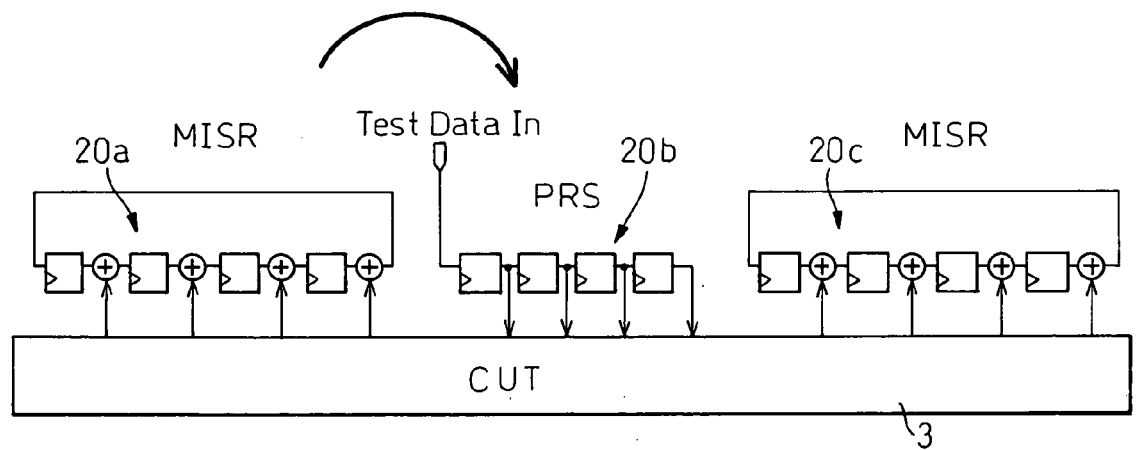
Figure 14:
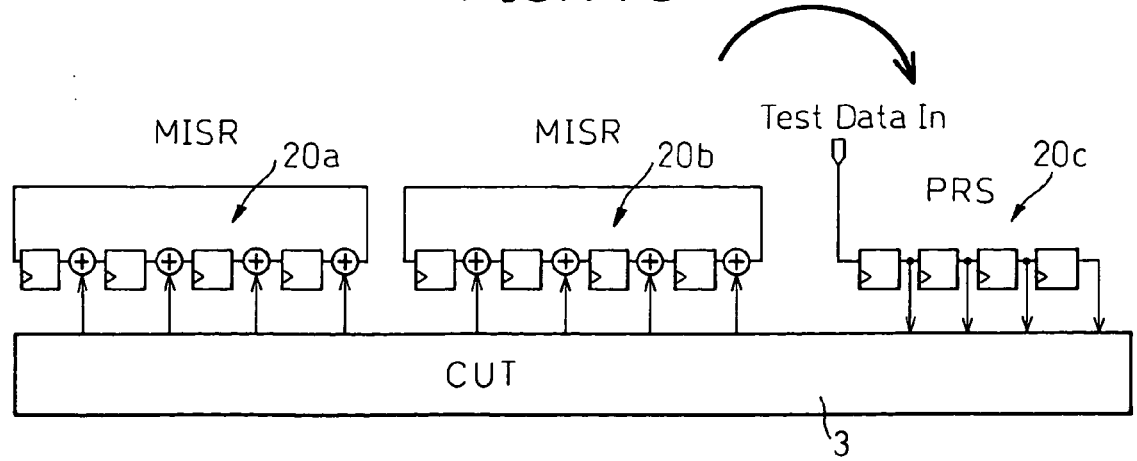

FIG. 14 is a schematic diagram showing an example of how the scan chain containing three sub scan-chains 20*a*, 20*b*, and 20*c* operates in the test mode. In the illustrated example, the time progresses from FIG. 14A toward FIG. 14C. First, in step 1 shown in FIG. 14A, the sub scan-chain 20*a* is set to perform the PRS operation, and the other sub scan-chains 20*b* and 20*c* are each set to perform the MISR operation. In this condition, all the test vectors are scanned in from the first selector in the sub scan-chain 20*a*, and the result of test response compaction is obtained from the sub scan-chain 20*b* operating as MISR. In this way, the combinational circuit corresponding to the sub scan-chain 20*a* is tested.

Then, in step 2 shown in FIG. 14B, the sub scan-chain 20*b* is set to perform the PRS operation, the other sub scan-chains 20*a* and 20*c* are each set to perform the MISR operation, and all the test vectors are scanned in from the first selector in the sub scan-chain 20*b*. The result of test response compaction is obtained from the sub scan-chain 20*c* set to operate as MISR. In this way, the combinational circuit corresponding to the sub scan-chain 20*b* is tested.

Next, in step 3 shown in FIG. 14C, the sub scan-chain 20*c* is set to perform the PRS operation, the other sub scan-chains 20*a* and 20*b* are each set to perform the MISR operation, and the same test operation as described above is performed. In this way, the combinational circuit corresponding to the sub scan-chain 20*c* are tested, completing the testing of the entire CUT 3.

Figure 15A:
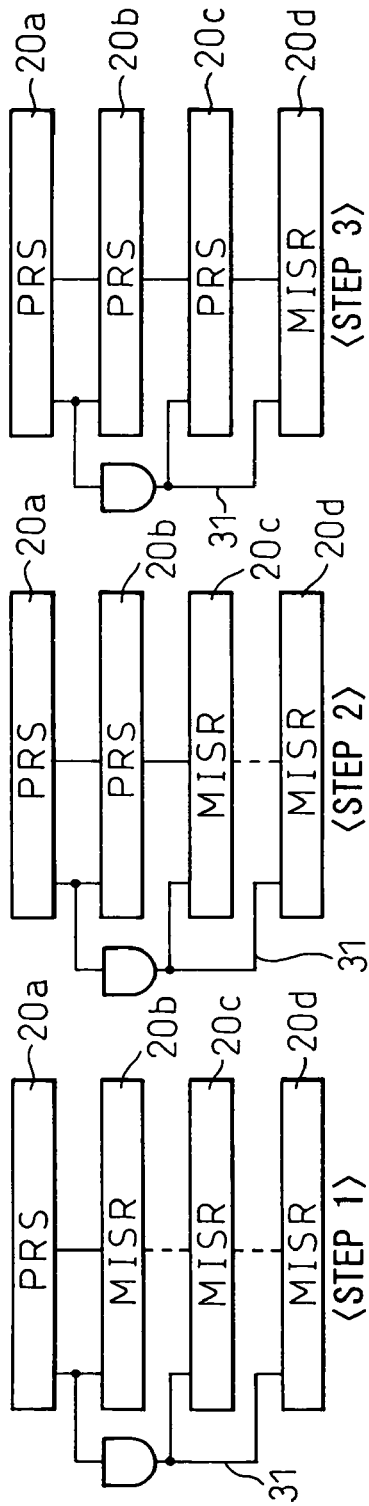
FIG. 15A is a diagram showing another example of the sub scan-chain function setting.

FIG. 15 is a diagram for explaining another example of the PRS/MISR setting of the plurality of sub scan-chains. The test schedule for setting the sub scan-chains as PRS/MISR is not limited to the one shown in FIG. 8 or FIG. 14. For example, the scheme shown in FIG. 15A is also possible; that is, in step 1, one sub scan-chain 20*a* is set as PRS and the others as MISR, in step 2 the sub scan-chains 20*a* and 20*b* are set as PRS and the others as MISR, and in step 3 the sub scan-chains 20*a*, 20*b*, and 20*c* are set as PRS and the sub scan-chain 20*d* as MISR.

In this case, in step 1, the test result of an AND gate having a path 31 such as shown in the figure can be transferred between the sub scan-chains 20*a* and 20*b*, but cannot be transferred between the other sub scan-chains. Likewise, in step 2, the transfer of the test result is possible between the sub scan-chains 20*a*, 20*b*, and 20*c*, but not possible between the sub scan-chains 20*c* and 20*d*. In step 3, the transfer of the test result is possible between all the sub scan-chains. As a result, the fault of the AND gate having the path 31 is detected by three scan tests.

Figure 15B:
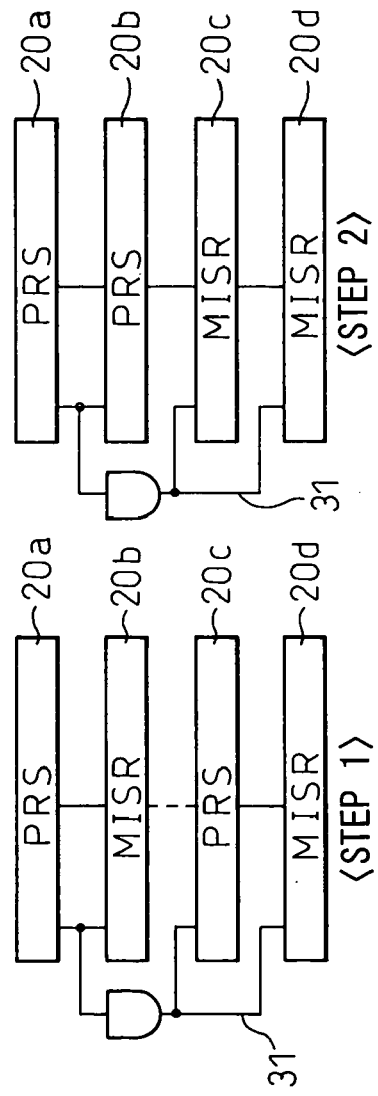
FIG. 15B is a diagram showing still another example of the sub scan-chain function setting.

When attention is paid to the detection of the fault of the circuit having the path 31, the fault test can be accomplished more efficiently by using the test schedule shown in FIG. 15B. That is, in step 1 of FIG. 15B, PRS and MISR are alternately set, and in step 2, the sub scan-chain 20*b* is set as PRS and the sub scan-chain 20*c* as MISR; in this way, the detection of the fault of the circuit having the path 31 is completed in two steps. In FIG. 15B, a dashed line indicates the segment along which the test result is not transferred.

In the semiconductor integrated circuit device incorporating the test configuration according to the present invention, the scan chain must be divided into smaller sub-chains in order to implement the test-per-clock testing. Further, the PRS does not capture responses. As a result, depending on the configuration of the scan chain, undetectable faults may occur due to an inability to propagate faults. If there is a path 32 entering the same sub scan-chain, as shown in FIG. 16, it is not possible to deterministically detect the stuck-at fault on the path 32 of the AND gate output. The detection of this fault must wait until a random pattern is applied which is generated when the sub scan-chain 20*a* is set as MISR. If many such paths exist, the fault coverage drops. Therefore, when forming a plurality of sub scan-chains by dividing the scan chain, the division must be done by considering the circuit structure.

Figure 18:
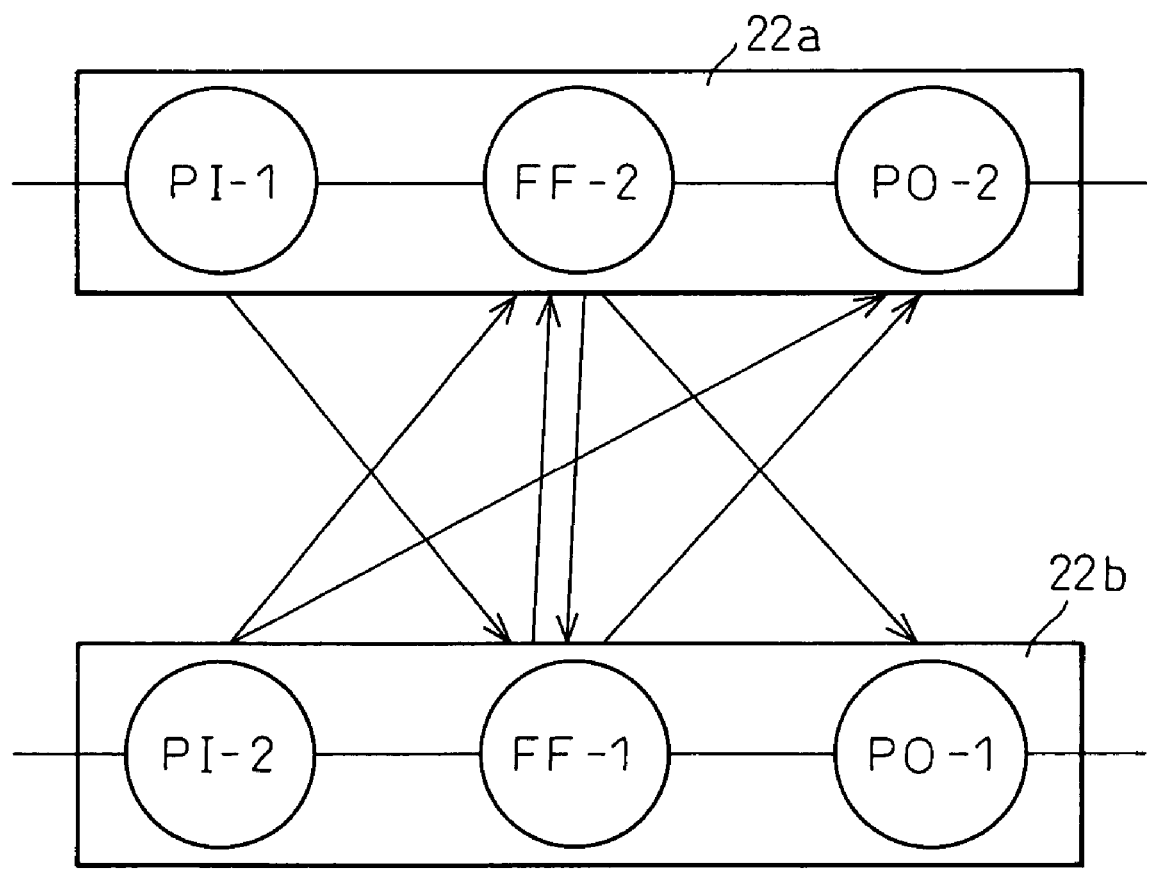
FIG. 18 is a diagram showing the sub scan-chains created by dividing the scan chain in accordance with the algorithm shown in FIG. 17.

FIG. 17 and 18 are diagrams for explaining one example of a scan chain dividing algorithm. First, in a circuit shown in FIG. 17A, the connections between the PI, PO, and FF in this circuit are analyzed, and a directed graph such as shown in FIG. 17B is constructed. When the path from PI-1 is traced in the output direction, the path reaches FF-1. This means that there is a path linking PI-1 to FF-1, and hence the relation PI-1→FF-1 is found. The other connections are analyzed in like manner, and finally the directed graph shown in FIG. 17B is constructed. Using this directed graph, the configuration of the scan chain is derived.

In FIG. 17B, if signal lines connected by an arrow are included in the same scan chain, a path is formed that feeds back to the same scan chain. The signal lines are marked with colors so that the signal lines connected by the same arrow are differently colored, and a scan chain is constructed for each color group. From the results shown in FIG. 17B, PI-1, FF-2, and PO-2 are marked with the same color (indicated by oblique hatching in the figure), and PI-2, FF-1, and PO-1 are marked with the same color. It is therefore understood that one sub scan-chain should be constructed with PI-1, FF-2, and PO-2 and another one with PI-2, FF-1, and PO-1.

FIG. 18 shows the configuration of the sub scan-chains 22a and 22b thus constructed. It can be seen from the illustrated configuration that all the outputs can be observed. Using this algorithm, it becomes possible to avoid the fault coverage dropping due to a division of the scan chain.

What is claimed is:

1. A semiconductor integrated circuit of a test configuration, comprising:
   a combinational circuit; and
   a scan circuit to test said combinational circuit, comprising:
      at least two sub scan circuits, each comprising a chain of flip flops connected with each other to realize a partially rotational scan function and a test response compaction function; and
      a selector selecting inputs to said sub scan circuits to determine whether said sub scan circuits perform said partially rotational scan function or said test response compaction function.

2. The semiconductor integrated circuit incorporating a test configuration as claimed in claim 1, wherein all of said sub scan circuits have the same number of flip-flop circuits.

3. A test method for a semiconductor integrated circuit incorporating a test configuration that comprises a combinational circuit and a scan chain constructed by connecting a plurality of scan flip-flop circuits in a chain, said scan chain being divided into a plurality of sub scan-chains each of which has a partially rotational scan function and a test response compaction function, comprising:
   conducting a first scan test by causing at least one of said plurality of sub scan-chains to perform said partially rotational scan function while causing at least another of said plurality of sub scan-chains to perform said test response compaction function, and
   after completion of said first scan test, conducting at least a second scan test by interchanging the sub scan-chains that perform said partially rotational scan function and the sub scan-chains that perform said test response compaction function.

4. The test method for a semiconductor integrated circuit incorporating a test configuration as claimed in claim 3, further comprising:
   conducting said first scan test by setting one half of said plurality of sub scan-chains to perform said partially rotational scan function and the other half thereof to perform said test response compaction function; and
   conducting said second scan test by interchanging the respective functions of said sub scan-chains.

5. The test method for a semiconductor integrated circuit incorporating a test configuration as claimed in claim 4, wherein said first and second scan tests are each conducted by using all of the test vectors.

6. The test method for a semiconductor integrated circuit incorporating a test configuration as claimed in claim 3, wherein said first and second scan tests are each conducted by using all of the test vectors.

7. A semiconductor integrated circuit incorporating a test configuration that comprises a combinational circuit and a scan chain constructed by connecting a plurality of scan flip-flop circuits in a chain, wherein:
   said scan chain is divided into a plurality of sub scan-chains, each having the same chain width, and
   each of said sub scan-chains comprises L rotation blocks (L is a natural number not smaller than 1), each comprising m flip-flop circuits (m is a natural number not smaller than 2) and m selectors each preceding a corresponding one of said m flip-flop circuits, wherein:
      a foremost one of said selectors in a foremost one of said L rotation blocks selects for output either an externally applied test vector or an output of said combinational circuit or an output of an endmost one of said flip-flop circuits in said foremost rotational block,
      a foremost one of said selectors in each of said rotation blocks other than said foremost block selects for output either an output of its preceding rotation block or an output of said combinational circuit or a sum of the output of said preceding rotation block and the output of said combinational circuit or an output of an endmost one of said flip-flop circuits in said each rotation block, and
      each of the other selectors selects for output either an output of its preceding flip-flop circuit or an output of said combinational circuit or a sum of the output of said preceding flip-flop circuit and the output of said combinational circuit.

8. The semiconductor integrated circuit incorporating the test configuration as claimed in claim 7, wherein said sum is produced by an exclusive-OR gate.

9. The semiconductor integrated circuit incorporating the test configuration as claimed in claim 8, wherein said foremost selector in said foremost rotation block is further supplied with a flip-flop circuit output obtained from an endmost one of said rotation blocks in said sub scan-chain.

10. The semiconductor integrated circuit incorporating the test configuration as claimed in claim 7, wherein said foremost selector in said foremost rotation block is further supplied with a flip-flop circuit output obtained from an endmost one of said rotation blocks in said sub scan-chain.

* * * * *